(12) United States Patent
Biber

(10) Patent No.: US 11,841,406 B2
(45) Date of Patent: Dec. 12, 2023

(54) MAGNETIC RESONANCE TOMOGRAPH AND METHOD FOR RAPID SWITCHOVER FROM TX TO RX

(71) Applicant: Siemens Healthcare GmbH, Erlangen (DE)

(72) Inventor: Stephan Biber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/544,070

(22) Filed: Dec. 7, 2021

(65) Prior Publication Data

US 2022/0196766 A1 Jun. 23, 2022

(30) Foreign Application Priority Data

Dec. 18, 2020 (EP) ..................................... 20215748

(51) Int. Cl.
*G01R 33/36* (2006.01)
*G01R 33/48* (2006.01)

(52) U.S. Cl.
CPC ......... *G01R 33/3664* (2013.01); *G01R 33/48* (2013.01)

(58) Field of Classification Search
CPC ............................ G01R 33/48; G01R 33/3664
See application file for complete search history.

(56) References Cited

U.S. PATENT DOCUMENTS

| | | | | |
|---|---|---|---|---|
| 4,949,041 A * | 8/1990 | Zur | ................... | G01R 33/56509 324/309 |
| 6,034,528 A * | 3/2000 | Heid | .................... | G01R 33/561 324/309 |
| 2008/0129298 A1* | 6/2008 | Vaughan | .............. | G01R 33/583 324/322 |
| 2009/0237077 A1* | 9/2009 | Vaughan | ............ | G01R 33/3635 324/322 |

(Continued)

FOREIGN PATENT DOCUMENTS

| | | |
|---|---|---|
| DE | 102016214441 B3 | 11/2017 |
| EP | 2270529 A1 | 1/2011 |
| WO | 2020054686 A1 | 3/2020 |

OTHER PUBLICATIONS

Agazi Samuel Tesfai et al: "Effects of Reduced Dead Times on the SNR of Tissue with Short T2* values"; Proceedings of the International Society for Magnetic Resonance in Medicine; ISMRM; Joint Annual Meeting ISMRM-ESMRMB; Paris, France, Jun. 2018. p. 5193.

(Continued)

*Primary Examiner* — Dixomara Vargas
(74) *Attorney, Agent, or Firm* — Lempia Summerfield Katz LLC

(57) ABSTRACT

A magnetic resonance tomograph and a method for operating a magnetic resonance tomograph. In a transmitting state of the magnetic resonance tomograph nuclear spins are excited in an object under examination with an excitation pulse by a high-frequency unit of the magnetic resonance tomograph via a transmitting antenna. The magnetic reso- (Continued)

nance tomograph is switched over from the transmitting state to a receiving state in a period of less than 40 microseconds. In a further step, in the receiving state, a magnetic resonance signal is received with a receiving antenna.

12 Claims, 2 Drawing Sheets

(56) References Cited

U.S. PATENT DOCUMENTS

| | | | | |
|---|---|---|---|---|
| 2011/0187371 | A1* | 8/2011 | Takegoshi | G01R 33/3621 324/322 |
| 2012/0098542 | A1 | 4/2012 | Van Helvoort et al. | |
| 2014/0070808 | A1* | 3/2014 | Reykowski | G01R 33/3657 324/309 |
| 2015/0022208 | A1* | 1/2015 | Biber | G01R 33/38 324/309 |
| 2015/0323698 | A1* | 11/2015 | Mandal | G01V 3/14 324/303 |
| 2016/0131727 | A1* | 5/2016 | Sacolick | G01R 33/445 324/318 |
| 2017/0176551 | A1* | 6/2017 | Deunsing | G01R 33/3415 |
| 2018/0038925 | A1 | 2/2018 | Maixner | |
| 2018/0081007 | A1 | 3/2018 | Stormont et al. | |
| 2019/0154773 | A1* | 5/2019 | Stack | G01R 33/34084 |
| 2019/0277927 | A1* | 9/2019 | Stickle | A61B 5/0042 |
| 2019/0310329 | A1* | 10/2019 | Malik | A61B 5/055 |
| 2019/0353722 | A1* | 11/2019 | Stormont | G01R 33/3628 |
| 2019/0353724 | A1* | 11/2019 | Snelten | G01R 33/3657 |
| 2019/0369176 | A1* | 12/2019 | Dalveren | G01R 33/34007 |
| 2019/0369180 | A1* | 12/2019 | Chang | G01R 33/0005 |
| 2019/0377040 | A1* | 12/2019 | Stack | G01R 33/34053 |
| 2020/0170514 | A1* | 6/2020 | Hui | A61B 5/0026 |
| 2020/0344706 | A1* | 10/2020 | Reykowski | H04W 56/004 |
| 2020/0348380 | A1* | 11/2020 | Taracila | G01R 33/3657 |
| 2022/0050157 | A1* | 2/2022 | Takahashi | G01R 33/34092 |
| 2022/0187395 | A1* | 6/2022 | Twieg | G01R 33/3628 |

OTHER PUBLICATIONS

Serano P et al: "Reconfigurable Electronic Tune-Detune Circuit for RF Coil Systems"; Proceedings of the International Society for Magnetic Resonance in Medicine; ISMRM; 17th Scientific Meeting and Exhibition; Honolulu, Hawaii, USA; Apr. 18-24, 2009; Apr. 4, 2009; p. 4770.

Weiger, Markus, et al. "High-Bandwidth ZTE Imaging with sub-Millisecond TR." Proceedings of the International Society for Magnetic Resonance in Medicine, 21st Annual Meeting and Exhibition, Salt Lake City, Utah, USA. vol. 21. 2013. p. 0761.

* cited by examiner

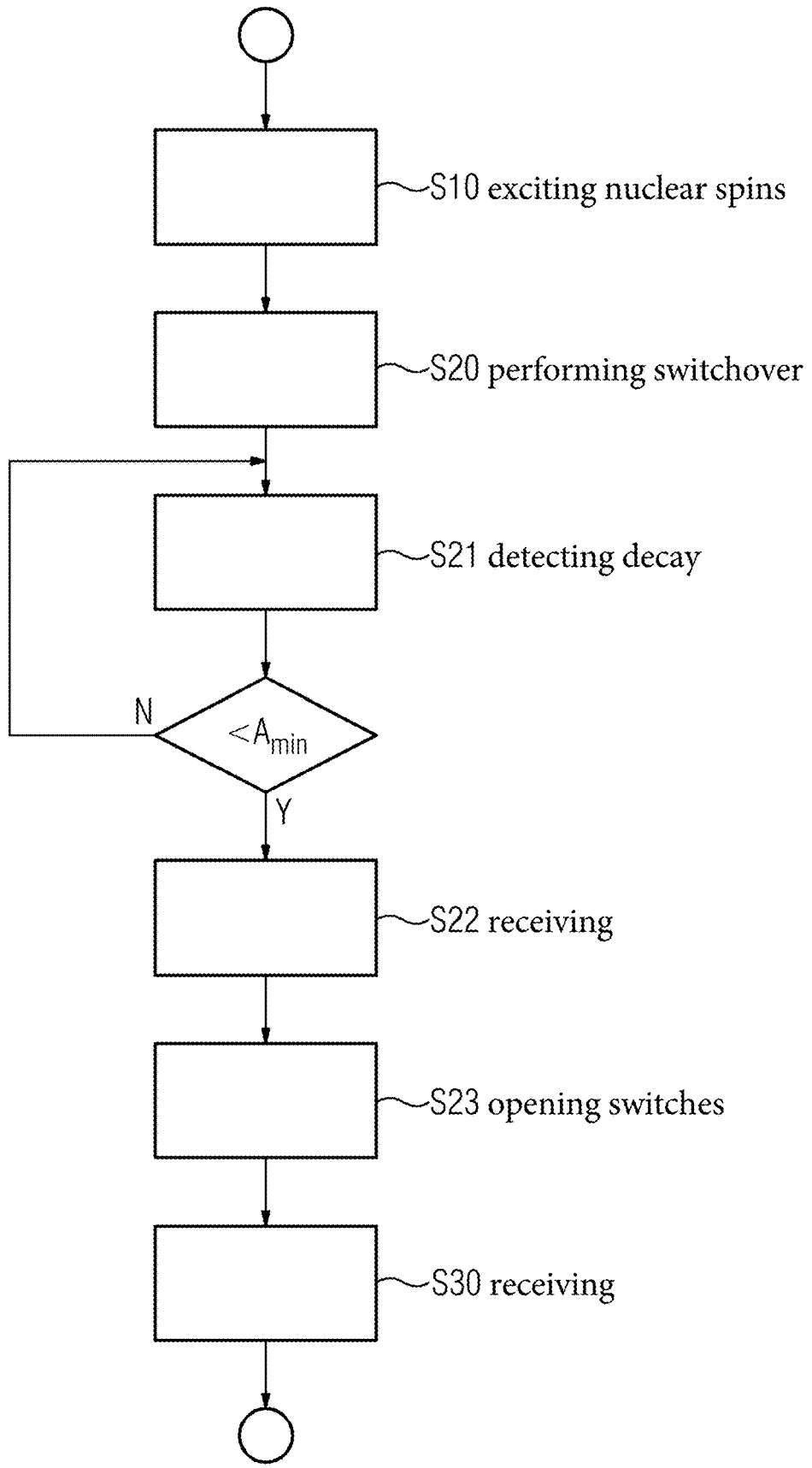

MAGNETIC RESONANCE TOMOGRAPH AND METHOD FOR RAPID SWITCHOVER FROM TX TO RX

CROSS REFERENCE TO RELATED APPLICATIONS

This application claims the benefit of EP20215748.3 filed on Dec. 18, 2020, which is hereby incorporated by reference in its entirety.

FIELD

Embodiments relate to a magnetic resonance tomograph and a method for operating a magnetic resonance tomograph. The magnetic resonance tomograph has a high-frequency unit, a transmitting antenna and a receiving antenna. During image capture, the magnetic resonance tomograph switches from a transmitting state into a receiving state.

BACKGROUND

Magnetic resonance tomographs are image-generating apparatuses which, for the purposes of imaging an object under examination, orient nuclear spins of the object under examination with a strong external magnetic field and excite the nuclear spins to precess around the orientation by an alternating magnetic field. The precession or return of the spins from the excited state into a lower-energy state in turn generates in response an alternating magnetic field which is received via antennas.

Spatial encoding is impressed onto the signals with the assistance of magnetic gradient fields, the encoding subsequently permitting assignment of the received signal to a volume element. The received signal is then evaluated and a three-dimensional image representing the object under examination is provided. The signal may be received by local receiving antennae known as "local coils" that are arranged in the immediate vicinity of the object under examination in order to achieve a better signal-to-noise ratio.

Magnetic resonance signals from nuclear spins decay exponentially over time. The decay rate becomes steeper with increasing interaction between the nuclear spin and the surrounding environment. While in water or fat the nuclear spin continues to yield signals after milliseconds, the lifetime in solids content such as teeth amounts to only a fraction thereof. In order additionally to obtain signals with a useful signal-to-noise ratio (SNR), the signal must be received as shortly as possible after emission.

The excitation pulse is conventionally emitted via a resonant transmitting antenna, to achieve the highest possible field strengths. Due to the resonance, however, the excitation signal also decays exponentially once the transmitter has been switched off and interferes with early reception of the magnetic resonance signal.

BRIEF SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments improve image capture with magnetic resonance signals with short relaxation times.

The method includes an act of using the high-frequency unit to excite nuclear spins to be examined, for example protons, with an excitation pulse. The excitation pulse is emitted in a transmitting state via a transmitting antenna, for example via a body coil; however, a local coil with transmit function may be used. The excitation pulse includes a peak power of more than 50 W, 200 W or 1000 W. The excitation pulse includes a frequency spectrum that lies around the Larmor frequency, and that is defined by the static magnetic field B0 of the magnetic resonance tomograph and the nuclear spin to be examined.

The magnetic resonance tomograph receives a magnetic resonance signal for imaging via a receiving antenna and the high-frequency unit. A signal is suitable for imaging if the magnetic resonance signal includes a sufficient SNR in relation to background or interference noise, for example an SNR greater than 6 dB, 12 dB or 18 dB. The receiving antenna is in this case a local coil but may also be a body coil or other antenna. The transmitting antenna may be the receiving antenna, i.e., for example for the body coil also to be used as a receiving antenna or for the local coil to have both a transmit and receive functionality.

A transmitting state in this case denotes a state or setting of high-frequency unit, transmitting antenna and/or receiving antenna that allows emission of the excitation pulse with the desired excitation of the nuclear spin as result and simultaneously prevents damage to the magnetic resonance tomograph, for example the transmitting antenna, receiving antenna and/or high-frequency unit.

A receiving state in this case denotes a state of high-frequency unit, transmit and receiving antenna that allows a magnetic resonance signal of the nuclear spins to be examined to be picked up using the receiving antenna and the high-frequency unit, that signal enables image reconstruction. Picked up signals with too low an SNR and/or too high an interference level are not suitable. The SNR or signal-to-noise ratio may be greater than 6 dB, 12 dB or 18 dB.

In the method, a switchover from the transmitting state to the receiving state takes place in less than 40 microseconds. How this rapid switchover is achieved in the individual embodiments is described in greater detail herein.

Advantageously, the rapid switchover from transmitting state to receiving state makes it possible to detect a magnetic resonance signal at the earliest possible point in time, before the amplitude drops too far for a satisfactory signal-to-noise ratio. In this way, image capture is improved even in solids with strong interaction and a short time constant T1 for decay of the excited nuclear spin state.

The magnetic resonance tomograph shares the advantages of the method.

In an embodiment of the magnetic resonance tomograph, the high-frequency unit includes one or more detuning devices and/or a duplexer, in other words two detuning devices or at least one detuning device and one duplexer. The term detuning device denotes a device with which the resonant frequency or the quality of an antenna may be modified by a control signal. Conventionally, PIN diodes are used as short-circuit switches or interrupters. The term duplexer denotes a device with which the path of a high-frequency signal, for example a magnetic resonance signal, from the receiving antenna to the receiver and/or of an excitation pulse from a high-frequency power amplifier to a transmitting antenna may be modified. The magnetic resonance tomograph furthermore includes a drive circuit that is in signal connection with at least two detuning devices or at least one detuning device and the duplexer. The drive circuit is configured simultaneously to initiate a switchover from a transmitting state to a receiving state for these units.

For example, both units to be switched over may be connected with a common signal line.

Simultaneously is also understood as meaning that one switchover switching operation is begun before another switching operation is terminated.

For example, the input of the high-frequency power amplifier may be switched to mute as soon as the excitation pulse is terminated, for example 0 to 10 microseconds thereafter. Within a time window of 5 to 10 microseconds around this point in time, the transmit detuning device is then brought into the detuned state, the receive detuning device into the tuned state and/or the duplexer into the receiving state.

Conventionally, firstly disabling of the transmitting antenna is enabled before the receiving antenna, to prevent interference with or destruction of the receiving antenna by the reverberating transmitting antenna. If the transmit/receive paths are suitably configured, it is possible, by simultaneous termination of the transmitting state and enabling of the receiving state, to reduce the gap between excitation and reception of the magnetic resonance signal in such a way that nuclear spins with a short relaxation time may also be modelled. It is thereby also possible to dampen an interference signal caused by switching of the duplexer by an already enabled detuning device.

In an embodiment of the magnetic resonance tomograph, the drive circuit includes a synchronizing device. The synchronizing device is configured to limit jitter on simultaneous switchover to a value of less than 5 microseconds, 2 microseconds or 1 microsecond. The signal connections from the drive circuit to the detuning devices and/or duplexer may run via a clocked gate, with the signals applied at the input of the drive circuit being commutated simultaneously with a clock signal at the output of the gate to the detuning devices and/or the duplexer.

The synchronizing device advantageously reduces the time discrepancy of the individual switchover operations and so allows the switchover operation as a whole to be accelerated.

In an embodiment of the magnetic resonance tomograph, the magnetic resonance tomograph includes a pickup coil for picking up the decay of the transmitting antenna after emission of an excitation pulse.

Advantageously, the pickup coil makes it possible to track an emission of a transmitting antenna, for example a body coil, and recognize when the amplitude of the high frequency alternating field generated by the decaying excitation falls below a predetermined value, at which the decaying alternating field continues to prevent reception of the magnetic resonance signal. The term pickup coil denotes a sensor independent of the receiving antenna. For example, it is thus possible in the case of a patient with a large body mass to enable an earlier switchover to the receiving state as a result of increased damping.

In an embodiment of the magnetic resonance tomograph, the high-frequency unit is configured, in the transmitting state, to pick up with the receiving antenna an emission of the transmitting antenna. The receiving antenna may be detuned in such a way in the transmitting state that the received excitation signal does not overdrive or destroy the receiver for magnetic resonance signals of the high-frequency unit but may nevertheless be evaluated. A damping member connected in the transmitting state into the signal connection between the receiver coil and the receiver may be used.

In this embodiment too, it is thus possible with a patient with a large body mass to enable an earlier switchover to the receiving state as a result of increased damping.

In an embodiment of the magnetic resonance tomograph, the duplexer includes two switches. In this case, any components that, under the control of a control input, are able to interrupt or produce an electrical connection, for example for a high-frequency signal, are regarded as switches. Examples are mechanical switching relays, MEMS, transistors, or FETs or also switching diodes such as PIN diodes. The switches together bring about a switchover between a transmitting state and a receiving state of the duplexer. Parallel connection and/or series connection of the two switches are possible. The two switches have two different driver circuits. The two switches may by switched mutually independently, for example also at different times. This may be coordinated by the controller 23. The first of the driver circuits may include a longer time constant than the second driver circuit. In this case, the two driver circuits may be driven simultaneously by the controller 23, but the different time constant then ensures that the two switches are actuated in succession in a predetermined manner.

Advantageously, an amplitude of the interference caused by the switching operation is reduced by successive switching of the two switches.

In an embodiment of the magnetic resonance tomograph, the high-frequency unit includes a high-frequency power amplifier with a control signal input for suppressing an emission. The high-frequency power amplifier is muted by a signal at the control signal input, but not isolated from the transmitting antenna. The input of the high-frequency power amplifier may for example be connected to a termination that feeds in a minimum noise signal. A DC voltage at which an amplifier noise factor is minimal may also be used.

The high-frequency power amplifier is often completely isolated from the transmitting antenna in the receiving state, so as to minimize noise emission. The control signal input, in contrast, allows a quicker switchover to the receiving state, inter alia also because the transmitting antenna is damped to a greater degree by the connected high-frequency power amplifier.

In an embodiment of the method, on switchover from a transmitting state to a receiving state the high-frequency unit detects a high-frequency alternating magnetic field emitted by the transmitting antenna. The transmitting antenna reverberates, for example due to the resonance thereof, at the frequency of the excitation pulse, and additional high-frequency signals may also be generated by the switchover operations and emitted via the transmitting antenna. Signal decay depends inter alia also on damping by the patient. The high-frequency alternating magnetic field may be detected for example with the above-mentioned pickup-coil. Detection by a local coil, may be performed, if the input thereof is sufficiently damped in the transmitting state. The high-frequency unit then only switches to the receiving state when the intensity of the electromagnetic alternating magnetic field falls below a predetermined limit value, for example an amplitude, that no longer overdrives a receiver of the high-frequency unit for the magnetic resonance signal in the receiving state.

Advantageously, reception may be picked up at the earliest possible time at which the magnetic resonance signal still includes a greater amplitude through detection of the emission of the transmitter coil during switchover from transmitting state to receiving state.

In an embodiment of the method, the high-frequency unit includes a duplexer between a high-frequency power amplifier and the transmitting antenna. In this embodiment of the method, in the receiving state, the transmitting antenna remains in electrical signal connection with the transmitting antenna.

The duplexer conventionally is provided to electrically isolate the high-frequency power amplifier from the transmitting antenna in a receiving state during magnetic resonance captures with a slow nuclear spin relaxation time, to minimize noise emission by the high-frequency-power amplifier and also damping of the magnetic resonance signal. However, the switchover process itself again causes interference and needs time for this to decay. In this embodiment of the method, omission of switchover of the duplexer advantageously enables quicker adoption of the receiving state and thus higher amplitude pickup of a magnetic resonance signal of the rapidly relaxing nuclear spin.

In an embodiment of the method, the high-frequency unit includes a duplexer between a high-frequency power amplifier and the transmitting antenna with two switches. The high-frequency unit successively switches the two switches on switchover from transmitting state to receiving state. For example, the high-frequency unit may actuate the switches successively with a time gap. The driver circuit of the switches may include a different delay, such that the high-frequency unit drives the two drivers simultaneously, but the switches switch one after the other.

Advantageously, subdivision into two switches with an offset switching time enables a reduction in the interference generated by the switching operation.

In an embodiment of the method, the transmitter coil is a body coil. In the receiving state, the high-frequency unit in this case leaves the body coil in the tuned state, in other words does not enable detuning.

Detuning of the body coil causes fluctuations in magnetic resonance signals that are picked up by the local coil as receiving antenna. By dispensing with the detuning of the body coil, magnetic resonance signals may advantageously be picked up at an earlier point in time and without interference.

The above-described characteristics, features and advantages of this invention and the manner in which these are achieved will become more clearly and distinctly comprehensible from the following description of the embodiments that are explained in greater detail in connection with the drawings, in which:

BRIEF DESCRIPTION OF THE FIGURES

FIG. 3 depicts a flow chart of an embodiment of the method.

DETAILED DESCRIPTION

Figure 1:
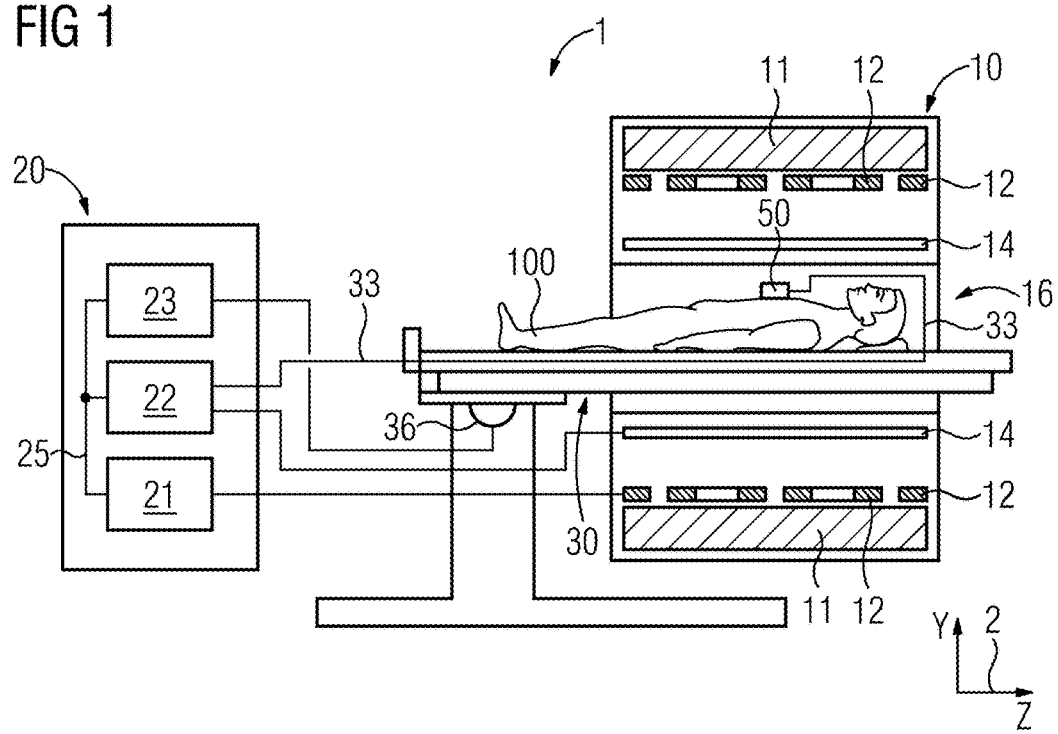
FIG. 1 depicts a schematic representation of a magnetic resonance tomograph according to an embodiment.

FIG. 1 depicts a schematic representation of an embodiment of a magnetic resonance tomograph.

The magnet unit 10 includes a field magnet 11 that generates a static magnetic field B0 for orienting nuclear spins of samples or of the patient 100 in a capture region. The capture region is distinguished by an extremely homogeneous static magnetic field B0. The homogeneity relates to the strength or magnitude of the magnetic field. The capture region is virtually spherical and arranged in a patient tunnel 16 that extends in a longitudinal direction 2 through the magnet unit 10. A patient couch 30 may be moved in the patient tunnel 16 by the positioning unit 36.

The field magnet 11 is conventionally a superconductive magnet that may provide magnetic fields with a magnetic flux density of up to 3 T or even higher in the case of the latest equipment. Permanent magnets or electromagnets with normally conductive coils may, however, also be used for lower field strengths.

The magnet unit 10 further includes gradient coils 12 that are configured to overlay variable magnetic fields in three spatial directions on the magnetic field B0 for spatial differentiation of the acquired imaging regions in the examination volume. The gradient coils 12 are conventionally coils of normally conductive wires that are capable of generating fields orthogonal to one another in the examination volume.

The magnet unit 10 likewise includes a body coil 14 that is configured to emit a high-frequency signal supplied via a signal lead into the examination volume and to receive resonance signals emitted by the patient 100 and deliver them via a signal lead. The term transmitting antenna is used below to designate an antenna via which the high-frequency signal is emitted to excite the nuclear spin. This may be the body coil 14, or indeed a local coil 50 with transmit function.

A control unit 20 supplies the magnet unit 10 with the various signals for the gradient coils 12 and the body coil 14 and evaluates the received signals.

The control unit 20 accordingly includes a gradient driver 21 that is configured to supply the gradient coils 12 via supply leads with variable currents that provide the desired gradient fields in the examination volume in time-coordinated manner.

The control unit 20 furthermore includes a high-frequency unit 22 that is configured to generate a high-frequency pulse with a specified time profile, amplitude and spectral power distribution in order to excite magnetic resonance of the nuclear spins in the patient 100. Pulse powers in the kilowatt range may be reached here. The excitation signals may be emitted via the body coil 14 or indeed via a local transmitting antenna into the patient 100. As detuning device, the body coil 14 includes a transmit detuning device 15, with which the body coil 14 may be switched between transmit tuning and a receive tuning. The body coil 14 may be tuned to the Larmor frequency for transmission, while in the receiving state the body coil 14 is detuned by the transmit detuning device 15 for reception via the local coils 50 explained below in such a way that it does not resonate at the Larmor frequency, in order not to couple to the magnetic resonance signals. In the transmitting state, a high-frequency power amplifier 26 is connected to the body coil 14 or another transmitting antenna via a duplexer 27. Under the control of a controller 23, the duplexer 27 may interrupt this connection or connect the transmitting antenna or body coil 14 with a termination resistor.

The controller 23 communicates via a signal bus 25 with the gradient controller 21 and the high-frequency unit 22.

A local coil 50, that is connected via a connecting lead 33 to the high-frequency unit 22 and the receiver thereof, is arranged on the patient 100 as receiving antenna. The body coil 14 may be a receiving antenna.

As detuning device, the local coil 15 includes a transmit detuning device 51, with which the body coil 50 may be switched between transmit tuning and receive tuning. Preferably, the local coil 50 is detuned on transmission via the body coil 14 in such a way that it does not resonate at the Larmor frequency, so as not to be destroyed by the high power of the excitation pulse. During reception, the local coil 50 is tuned to the Larmor frequency by the receive detuning device 51.

Figure 2:
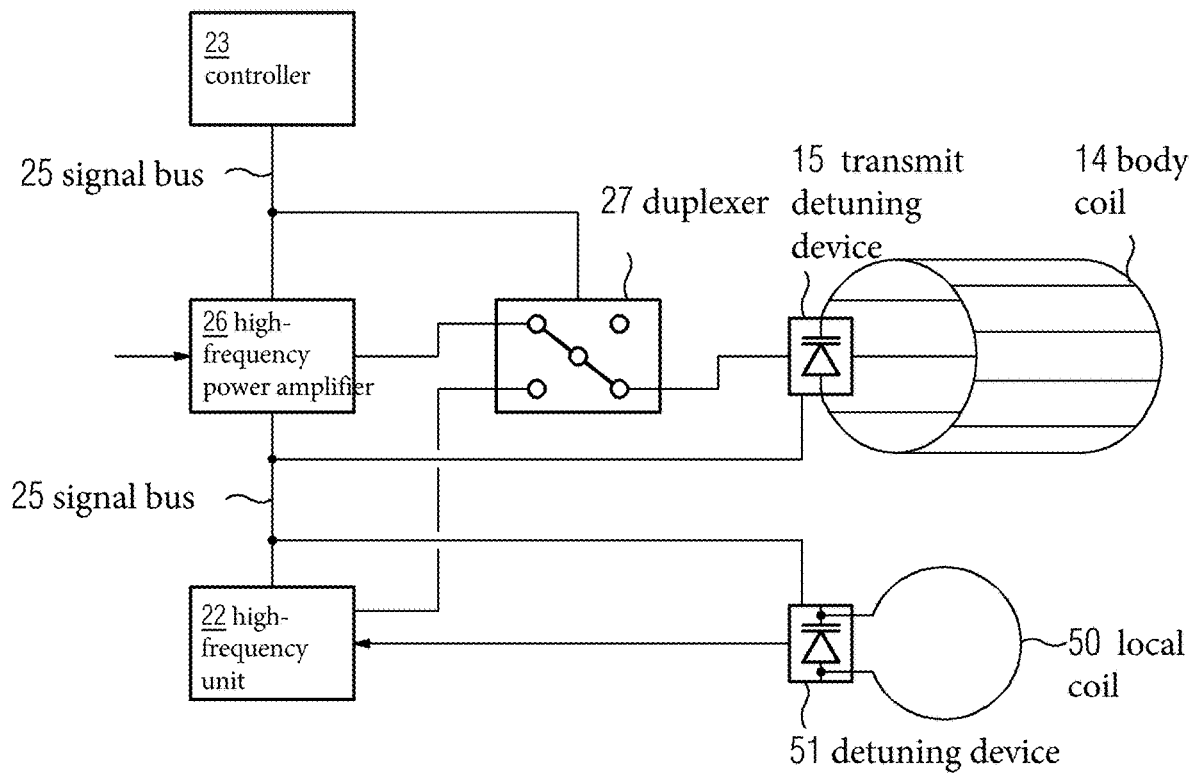
FIG. 2 depicts a schematic representation of the apparatuses of the magnetic resonance tomograph involved in a method according to an embodiment.

FIG. 2 depicts, by way of example, a schematic representation of the apparatuses of the magnetic resonance tomograph involved in the method.

As transmitting antenna, a body coil 14 includes a transmit detuning device 15. This is shown symbolically by a PIN diode as switching element, with further elements such as capacitors for DC decoupling or inductors as a high-frequency choke are not shown. The PIN diode may be switched through in forward direction by a DC voltage or used by a blocking voltage as an adjustable capacitor. Depending on the circuitry, the receiving antenna may for example be short-circuited by the PIN diode or the transmitting antenna may be detuned by a capacitor connected via the PIN diode.

The detuning devices may be switched via a signal connection by the controller 23 by a voltage or current. Also conceivable is a control circuit in the detuning device, that, as a result of a command via the signal connection, supplies the PIN diode with a voltage or a current.

The local coil 50, as receiving antenna, also includes a corresponding receive detuning device 51, that may likewise be configured with a PIN diode. The explanations relating to the circuit technology of the transmit detuning device 15 also apply mutatis mutandis to the receive detuning device 51. In the transmitting state, the receive detuning device 51 detunes the local coil 50, to protect it from damage by the excitation pulse, and, in the receiving state, makes it resonant at the Larmor frequency of the nuclear spins to be investigated, such that sensitivity to the magnetic resonance signal to be received is as great as possible.

As transmitting antenna, the body coil 14 is connected via a signal connection to the high-frequency power amplifier 26, from which it may be supplied with a high-frequency signal such as an excitation pulse. Connected into the signal connection is a duplexer 27, that, driven by the controller 23, connects the transmitting antenna to the high-frequency power amplifier 26 in the transmitting state.

Different connections may be used in a receiving state. For example, the connection between transmitting antenna and high-frequency power amplifier may be interrupted by the duplexer 27. If the body coil 14 is also the receiving antenna, the duplexer 27 may produce a signal connection between the body coil 14 and a receiver in the high-frequency unit 22. The transmitting antenna and/or the high-frequency power amplifier 26 may be connected in the receiving state with a signal sink such as a termination resistor. To this end, the duplexer 27 includes at least one switch, that, controlled by the controller 23, may interrupt the connection between high-frequency power amplifier 26 and the transmitting antenna. A multiway switch may for example also connect the body coil 14 to a receiver of the high-frequency unit or the high-frequency power amplifier 26 with a signal sink such as a dummy. The duplexer may include a passive device such as a gyrator that forwards a signal depending on the direction of propagation.

Switchover by a plurality of switches in series, parallel or indeed in more complex arrangements, may be performed by which the switching operation is distributed to a plurality of switches. Provided actuation of the switches takes place at different times, an interference signal arising as a result of the switching operation may be reduced in amplitude, for example by the lower currents or charges, and the entire switching operation accelerated.

FIG. 3 depicts a flow chart of a method.

At Act S10, the magnetic resonance tomograph excites nuclear spins to be detected in the patient 100 with an excitation pulse from the high-frequency power amplifier 26 via the transmitting antenna, for example the body coil 14. The magnetic resonance tomograph 1 is in a transmitting state, in which the transmit detuning device 15 tunes the transmitting antenna to the Larmor frequency to generate as strong and homogeneous an excitation as possible with the generated B1 field. In the transmitting state, the duplexer 27 produces an electrical connection between the high-frequency power amplifier 26 and the transmitting antenna for the excitation pulse. The excitation pulse may be damped only to a slight degree, for example by less than 6 dB, 3 dB or 1 dB between the high-frequency power amplifier and the transmitting antenna.

In the transmitting state, the receiver coil, for example a local coil 50, is set by the receive detuning device 51 to a state in which the excitation pulse cannot cause any damage to the receiving antenna or a constitute a danger to the patient 100 through heating or induced voltages. The receive detuning device 51 detunes the receiving antenna at its resonant frequency such that the voltage induced by the excitation pulse is reduced by more than 24 dB, 48 dB, 60 dB or 96 dB relative to the tuned state. Alternatively, or in addition, the detuning device may short-circuit the receiving antenna or segments thereof for example with a PIN diode.

At Act S20, the controller 23 performs a switchover from the transmitting state to the receiving state by the transmit detuning device 14 and the receive detuning device 51 and the duplexer 27. Switchover proceeds in less than 40 microseconds, to allow reception of the exponentially falling magnetic resonance signal at the earliest possible point in time and thus with the greatest possible amplitude. Since different mechanisms allow this and it depends in turn on the details of the end state, i.e., the receiving state, this will hereinafter be addressed first, before the switchover operation in act S20 is explained more precisely.

At Act S30, the magnetic resonance tomograph 1 receives a magnetic resonance signal with a receiver of the high-frequency unit 22 via a receiving antenna, for example the local coil 50. The magnetic resonance signal is conditioned by the high-frequency unit 22 and then an image is reconstructed and stored or output by a computer, for example the control unit 20 or an external computer. In this case, the transmit detuning device 15, the receive detuning device 51 and the duplexer are in a receiving state.

The receiving state is defined for the receiving antenna by a setting of the receive detuning device 51, in which the receiving antenna supplies a substantially maximal signal and/or a signal with a substantially maximal signal-to-noise ratio at the Larmor frequency of the magnetic resonance signal. Substantially maximal is understood to mean that the amplitude of the signal is less than 3 dB, 6 dB or 12 dB below an absolute maximum for the given magnetic resonance signal. This is conventionally the case if the receiving antenna is resonant at the Larmor frequency, for example by resonantly tuning an antenna loop of a local coil 50 by a series capacitor of the receive detuning device 51. Stronger coupling of the antenna loop with an input amplifier may make the resonance broader, but of smaller amplitude, such that although the maximal signal is smaller, a high signal is nonetheless still delivered in the event of resonance displacement by the patient 100. The receiving state may include adjustment of a matching circuit of the receive detuning device 51, in order to minimize the noise factor of the input stage.

In an embodiment of the method, the transmitting antenna, insofar as this is not simultaneously the receiving antenna, is detuned in the receiving state, i.e. is tuned by the transmit detuning device 15 to a resonant frequency that is so remote from the Larmor frequency that a signal induced by a B1 field of the nuclear spins in the transmit antenna is damped by more than 12 dB, 24 dB, 48 dB or 60 dB relative to a signal of the transmitting antenna with a resonant frequency equal to the Larmor frequency and identical to B1.

The transmit detuning device 15 may alternatively or additionally damp the transmitting antenna, for example by the transmit detuning device 15 closing or short-circuiting a resistance significantly less than the impedance of the transmitting antenna via the feed point thereof. The transmit detuning device 15 may short-circuit the transmitting antenna at two locations other than the feed point, such that the transmitting antenna is subdivided into two substantially equally large segments, that simultaneously significantly modifies the resonant frequency.

Depending on the embodiment of the method, in the receiving state, the duplexer 27 may isolate the high-frequency power amplifier 26 from the transmitting antenna or indeed maintain an electrical connection.

If the duplexer 27 disconnects the connection, idling noise of the high-frequency-power amplifier 26 may indeed on the one hand no longer be emitted via the transmitting antenna. However, the transmitting antenna is then also no longer damped by the high-frequency power amplifier 26, such that this reverberates for longer at the frequency and with the energy of the excitation pulse.

If, in one embodiment of the method, the duplexer 27 does not isolate the high-frequency power amplifier 26 from the transmitting antenna, then the high-frequency power amplifier includes a control input via which it may be muted. The controller 23 then mutes the high-frequency power amplifier 26 or grounds the signal input, such that noise is minimized to the inherent noise of the end stage; simultaneously, however, the transmitting antenna is terminated with a matching impedance via the connection to the high-frequency power amplifier 26 and damped by the output resistance of the end stage.

Switchover in act S20 may differ depending on the receiving state of the respective embodiment of the method.

If, for example, the signal connection is maintained in the receiving state between the high-frequency power amplifier 26 and the transmitting antenna, in the switchover, the high-frequency power amplifier is muted by the controller 23 via a control signal input of the high-frequency power amplifier. The high-frequency power amplifier 26 may for instance damp the transmitting antenna and, in this way, ensure faster decay of the excitation pulse in the transmitting antenna, such that the receiving state is achieved more quickly. The noise of the high-frequency power amplifier 26 is simultaneously reduced by the muting. The gain in signal strength of the received signal by the earlier point in time of switchover in this case outweighs the higher noise, such that as a whole the SNR is improved.

In an embodiment of the method, during switchover the duplexer 27 isolates the high-frequency power amplifier 26 from the transmitting antenna. In this case, the duplexer 27 includes two switches, that jointly produce the connection when closed or isolation when both open. The controller 23 in this case opens the switches one after the other, At Act S23, for example with a gap of more than 5 microseconds, 10 microseconds or 20 microseconds, but with a gap of less than 30 microseconds. Isolation of the connection itself produces interference, that is reduced by distribution over two switches, connected for example in parallel or series that are actuated at different intervals. As a result, this decays more quickly and the receiving state may be achieved earlier despite the additional delay from picking up a magnetic resonance signal.

In an embodiment, muting of the high-frequency power amplifier 26 proceeds over a time interval T1, that is between 0 and 10 microseconds after the end of the excitation pulse. In a time interval of 5 to 10 microseconds around T1, switchover of the duplexer 27 to the receiving state then takes place, as do detuning of the transmit detuning device 15 and tuning of the receive detuning device 51.

In an embodiment of the method, the controller 23 firstly may detect with a sensor, at Act S21, a decay of the oscillation in the transmitting antenna after the end of the active excitation pulse. In this case, it is conceivable for acts S22, S23 of the switchover to be carried out completely or in part during act S21. As the sensor, the local coil 50 may for example be used if the input signal is damped to such an extent in the transmitting state of the receive detuning device 51 that it may be quantitatively detected and evaluated. The local coil 50 may be isolated from the receiver in a transmitting state of the duplexer 27, but for crosstalk of the open duplexer 27 to be sufficient quantitatively to detect the decaying excitation pulse with the receiver. Finally, the magnetic resonance tomograph 1 may also include a separate high-frequency sensor, for example a pickup-coil for this purpose.

If the level of the decaying excitation pulse drops below a predetermined threshold value, the controller 23 switches the receive detuning device 51 and the duplexer 27 to the receiving state at Act S22 and then, with act 30, begins reception of the magnetic resonance signal at the earliest possible point in time. The predetermined threshold value may in this case be determined from the exponential drop in the magnetic resonance signal and the noise level such that the SNR to be expected allows imaging.

Advantageously, different levels of damping by the patient 100 may in this way be examined and the signal optimized. Act S21 may in this case be performed just once at the start of a measurement for the patient 100 or subsequently with each excitation pulse.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomograph comprising:
   a transmitting antenna;
   a receiving antenna; and a high-frequency unit configured to switch over the transmitting antenna, the receiving antenna, or the transmitting antenna and receiving antenna from a transmitting state to a receiving state in a period of less than 40 microseconds, wherein the high-frequency unit comprises a drive circuit that is in signal connection with at least two detuning devices or at least one detuning device and a duplexer, wherein the drive circuit further comprises a synchronization device configured to limit jitter on simultaneous switchover to a value of less than 5 microseconds, 2 microseconds, or 1 microsecond.

2. The magnetic resonance tomograph of claim 1, wherein the drive circuit is configured simultaneously to initiate switchover from a transmitting state to a receiving state for the at least two detuning devices or the at least one detuning device and the duplexer.

3. The magnetic resonance tomograph of claim 1, further comprising:
a pickup coil configured to pick up a decay of the transmitting antenna after emission of an excitation pulse.

4. The magnetic resonance tomograph of claim 1 wherein the high-frequency unit is further configured, in the transmitting state, to pick up with the receiving antenna an emission of the transmitting antenna.

5. The magnetic resonance tomograph of claim 1, further comprising:
wherein the duplexer comprises two switches with two different driver circuits for switching over between a transmitting state and a receiving state, wherein a first of the two different driver circuits includes a longer time constant than a second driver circuit of the two different driver circuits.

6. The magnetic resonance tomograph of claim 1 wherein the high-frequency unit comprises a high-frequency power amplifier with a control signal input for suppressing emission.

7. A method for operating a magnetic resonance tomograph with a high-frequency unit, the method comprising:
exciting nuclear spins in an object under examination with an excitation pulse by the high-frequency unit via a transmitting antenna in a transmitting state, wherein the high-frequency unit comprises a drive circuit that is in signal connection with at least two detuning devices or at least one detuning device and a duplexer,
detecting, by the high-frequency unit, an electromagnetic alternating field emitted by the transmitting antenna;
switching over from the transmitting state to a receiving state when an intensity of the electromagnetic alternating field falls below a predetermined limit value, wherein switchover proceeds in less than 40 microseconds; and
in the receiving state, receiving a magnetic resonance signal with a receiving antenna.

8. The method of claim 7, wherein the high-frequency unit comprises the duplexer between a high-frequency power amplifier and the transmitting antenna and, in the receiving state, the transmitting antenna remains in electrical signal connection with the transmitting antenna.

9. The method of claim 7, wherein the high-frequency unit comprises the duplexer between a high-frequency power amplifier and the transmitting antenna with two switches for switching over between transmitting state and receiving state, wherein the high-frequency unit switches the two switches in succession on switchover from the transmitting state to the receiving state.

10. The method of claim 7, wherein, in the receiving state, a transmit coil is a body coil and the body coil remains in a tuned state.

11. A non-transitory computer implemented storage medium that stores machine-readable instructions executable by at least one processor of a magnetic resonance tomograph, the machine-readable instructions comprising:
exciting nuclear spins in an object under examination with an excitation pulse by a high-frequency unit of the magnetic resonance tomograph via a transmitting antenna in a transmitting state, wherein the high-frequency unit comprises a drive circuit that is in signal connection with at least two detuning devices or at least one detuning device and a duplexer,
identifying an electromagnetic alternating field emitted by the transmitting antenna;
switching over from the transmitting state to a receiving state after an intensity of the electromagnetic alternating field falls below a predetermined limit value, wherein switchover proceeds in less than 40 microseconds; and
in the receiving state, receiving a magnetic resonance signal from a receiving antenna.

12. A magnetic resonance tomograph comprising:
a transmitting antenna;
a receiving antenna; and
a high-frequency unit configured to switch over the transmitting antenna, the receiving antenna, or the transmitting antenna and receiving antenna from a transmitting state to a receiving state in a period of less than 40 microseconds, wherein the high-frequency unit comprises a drive circuit that is in signal connection with at least one detuning device and a duplexer, wherein the duplexer comprises two switches with two different driver circuits for switching over between a transmitting state and a receiving state, wherein a first of the two different driver circuits includes a longer time constant than a second driver circuit of the two different driver circuits.

* * * * *